(12) United States Patent
Ebihara et al.

(10) Patent No.: US 6,219,807 B1
(45) Date of Patent: Apr. 17, 2001

(54) SEMICONDUCTOR MEMORY DEVICE HAVING AN ECC CIRCUIT

(75) Inventors: Nobuyuki Ebihara; Masami Ochiai, both of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/190,620

(22) Filed: Nov. 12, 1998

(30) Foreign Application Priority Data

Nov. 14, 1997 (JP) .................................................. 9-331095

(51) Int. Cl.[7] .................................................. G11C 29/00
(52) U.S. Cl. .......................... 714/720; 714/766; 714/805; 365/201; 365/200
(58) Field of Search .................................... 714/763, 720, 714/766, 770, 752, 6, 49, 52, 54, 718, 805; 365/200, 201

(56) References Cited

U.S. PATENT DOCUMENTS

| | | | |
|---|---|---|---|
| 5,172,339 | * 12/1992 | Noguchi et al. | 714/720 |
| 5,195,099 | * 3/1993 | Ueda et al. | 714/766 |
| 5,467,357 | * 11/1995 | Asami | 714/720 |
| 5,638,385 | * 6/1997 | Fifield | 714/763 |
| 5,881,072 | * 3/1999 | Dell | 714/763 |

OTHER PUBLICATIONS

"Two–Pass Stuck–Fault Memory Test Error Correction Code", IBM Technical Disclosure Bulletin, vol. 28, No. 12, May 1986, pp. 5170–5171.

"Testing Check Bits at No Cost in RAMs with On–Chip ECC", by P. Ramanathan, et al., IEE Proceedings E. Computers & Digital Techniques, vol. 140, No. 6, Part E, Nov. 1, 1993, pp. 304–312.

* cited by examiner

*Primary Examiner*—Albert Decady
*Assistant Examiner*—Emeka J. Amanze
(74) *Attorney, Agent, or Firm*—Scully, Scott, Murphy & Presser (57) ABSTRACT

To provide a semiconductor memory device having an ECC circuit whereof checker-data inspection of memory cells in the user areas and the ECC areas can be performed at once, the ECC code generation circuit generates the ECC code of six bits whereof logic of each bit has XOR logic of each of six different combinations of 15 bits of the data set of 32 bits, and addresses in every user areas of the bit-columns are arranged in an order of 1, 4, 2, 5, 3, 6, . . . , b, f. When a checkerboard pattern is written, a first data set having 32 bits of logic '0' and a second data set having 32 bits of logic '1' are written alternately, in addresses $4n$ to $4n+3$ and $4(n+1)$ to $4(n+1)+3$ of the user areas on odd-numbered word-lines, and written alternately on even-numbered word-lines in an inverse order of the odd-numbered word-lines, when checker-data inspection of the memory-cell array is performed, n being an integer not less than 0.

4 Claims, 7 Drawing Sheets

| ADDRESS | 4n+3 | 4n+2 | 4n+1 | 4n | 4n |
|---|---|---|---|---|---|
| BIT | D31-D24 | D23-D16 | D15-D08 | D07-D00 | OO-O5 |
| BIT-PATTERN BP1 | 00000000 | 00000000 | 00000000 | 00000000 | 00000000 |
| BIT-PATTERN BP2 | 11111111 | 11111111 | 11111111 | 11111111 | 11111111 |

FIG. 3

| ADDRESS | USER AREA | ECC AREA |
|---|---|---|
| | 04152637 8c9ddebf | 048c |
| WORD-LINE #1 | 0101010101010101 | 0101 |
| WORD-LINE #2 | 1010101010101010 | 1010 |
| WORD-LINE #3 | 0101010101010101 | 0101 |
| WORD-LINE #4 | 1010101010101010 | 1010 |

| ADDRESS | USER AREA | ECC AREA |
|---|---|---|
| WORD-LINE #1 | 0123456789abcdef | 048c |
| WORD-LINE #2 | 0101010101010101 | 1111 |
| WORD-LINE #3 | 1010101010101010 | 1111 |
| WORD-LINE #4 | 0101010101010101 | 1111 |
| | 1010101010101010 | 1111 |

FIG.7 PRIOR ART

| ADDRESS | 4n+3 | 4n+2 | 4n+1 | 4n | 4n |
|---|---|---|---|---|---|
| BIT | D31-D24 | D23-D16 | D15-D08 | D07-D00 | O0-O5 |
| BIT-PATTERN BP11 | 11111111 | 00000000 | 11111111 | 00000000 | 100001 |
| BIT-PATTERN BP12 | 00000000 | 11111111 | 00000000 | 11111111 | 100001 |

SEMICONDUCTOR MEMORY DEVICE HAVING AN ECC CIRCUIT

BACKGROUND OF THE INVENTION

The present invention relates to a semiconductor memory device having an error checking and correcting (hereinafter abbreviated as ECC) circuit for correcting data error caused by a memory cell defect.

Figure 4:
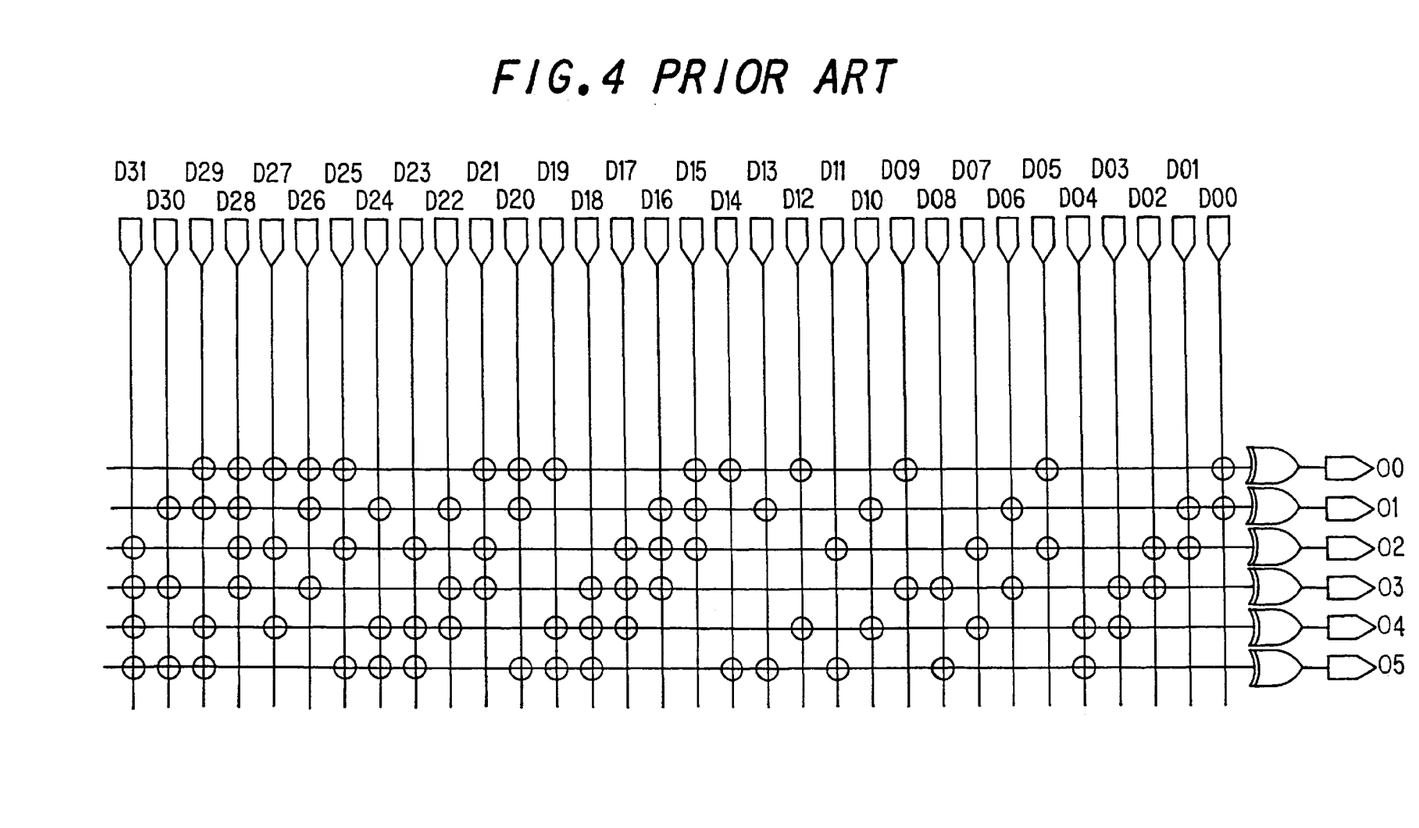
FIG. 4 is a schematic diagram illustrating a conventional example of an ECC code generation circuit.

FIG. 4 is a schematic diagram illustrating a conventional example of an ECC code generation circuit.

For checking and correcting a one-bit error in 32-bit data, an ECC code of six bits is necessary. In the conventional example of FIG. 4, each bit (outputted from each of output terminals O0 to O5 of FIG. 4) of the ECC code is so generated as to have XOR (eXclusive OR) logic of each different combination of 14 bits (indicated by circles depicted on horizontal lines each connected to respective one of the output terminals O0 to O5 through a symbol of an XOR gate) of the 32-bit data inputted from input terminals D00 to D31.

Figure 5:
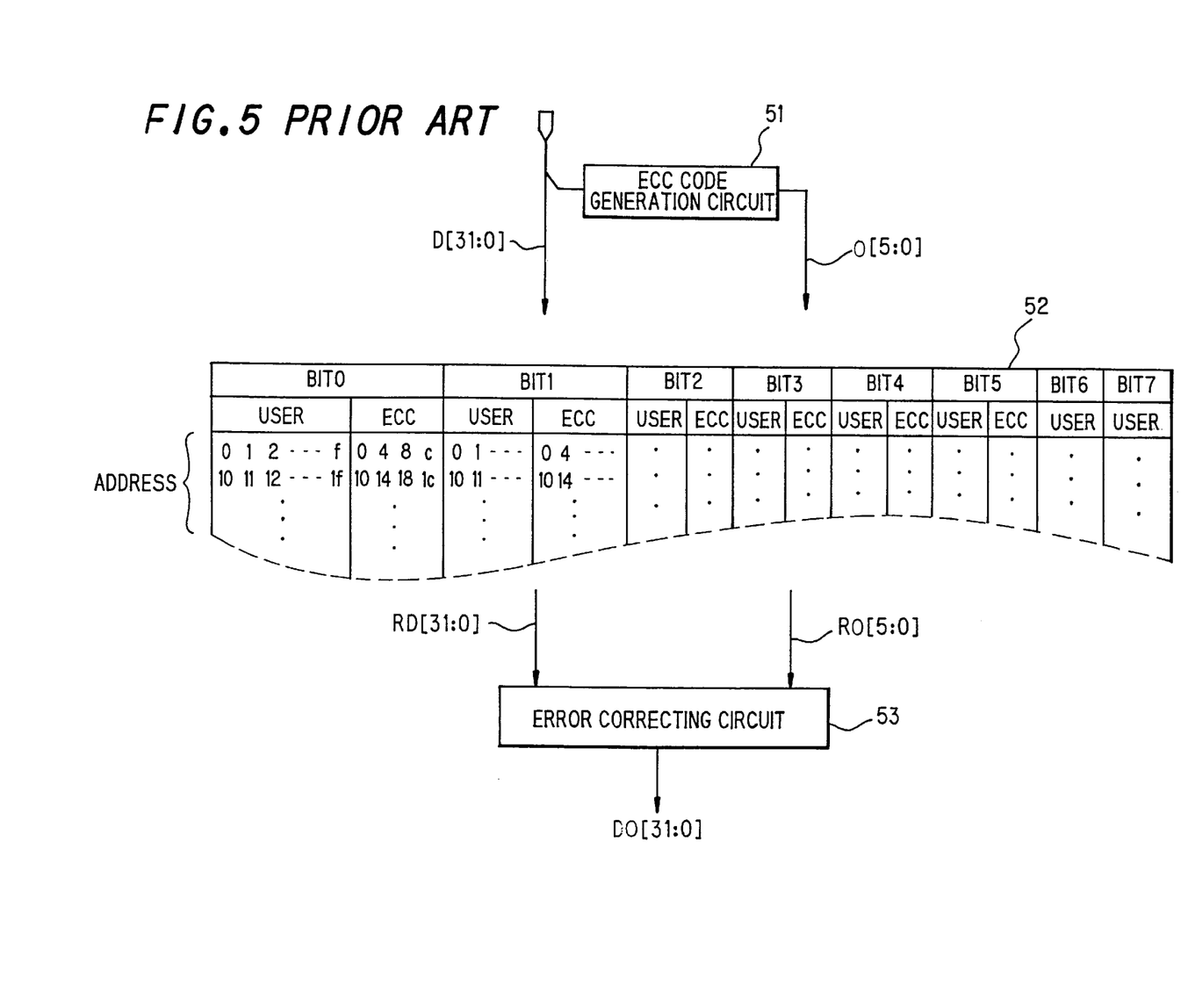
FIG. 5 is a schematic diagram illustrating data writing/reading of a conventional semiconductor memory device having an ECC circuit making use of the ECC code generation circuit of FIG. 4.

FIG. 5 is a schematic diagram illustrating data writing/reading of a conventional semiconductor memory device having an ECC circuit making use of the ECC code generation circuit of FIG. 4.

When input data D[31:0] of 32 bits are supplied to be written in a memory-cell array 52, an ECC code O[5:0] of 6 bits is generated by an ECC code generation circuit 51 from the input data D[31:0] as above described in connection with FIG. 4.

The input data D[31:0] of 32 bits are written in the memory-cell array 52 being divided into four addresses 4n, 4n+1, 4n+2 and 4n+3 (n=0, 1, 2, . . . ) 8 bits by 8 bits. That is, when n=0, for example, first 8 bits D[7:0] of the input data are written in memory cells of an address 0 of user areas of bit-columns BIT0 to BIT7. In the same way, second, third and fourth 8 bits D[15:8], D[23:16] and D[31:24] are written in memory cells of addresses 1, 2 and 3, respectively, of the user areas of the bit-columns BIT0 to BIT7.

In parallel with the input data D[31:0] of 32 bits, the ECC code O[5:0] of 6 bits generated from the input data D[31:0] is written in memory cells of an address 4n of ECC areas of the bit-columns BIT0 to BIT5 (the bit-columns BIT6 and BIT7 have no ECC area). That is, first to sixth bits of the ECC code O[5:0] are written in memory cells of an address 0 of ECC areas of the bit-columns BIT0 to BIT5 when n=0, or address 4 when n=1, respectively.

Thus, input data of 32 bits and their ECC code of 6 bits are written in the memory-cell array 52, 38 bits by 38 bits, by incrementing n when the input data are to be written sequentially, and four sets of 38-bit data are written in each word-line of the memory-cell array 52, in the conventional examples of FIG. 5.

When data are read out from the memory-cell array 52, user area data RD[31:0] of 32 bits from four addresses 4n, 4n+1, 4n+2 and 4n+3 of the user areas of bit-columns BIT0 to BIT7 and ECC area data RO[5:0] of 6 bits from the corresponding address 4n of ECC areas of the bit-columns BIT0 to BIT5 are read out in parallel and supplied to an error correcting circuit 53. The error correcting circuit 53 reproduces output data DO[31:0] of 32 bits having the same logic with the input data D[31:0] making use of the ECC area data RO[5:0] even if there is one-bit error in the 38 bits of the user area data RD[31:0] and the ECC area data RO[5:0] read out from the memory-cell array 52.

Now, product inspection of memory-cell arrays is described.

Before shipping memory-cell arrays, product inspection is performed for checking if there is any defect, such as a bit interference defect, in memory-cell arrays to be shipped. Checker data writing and reading is a method used for the product inspection.

Figure 6:
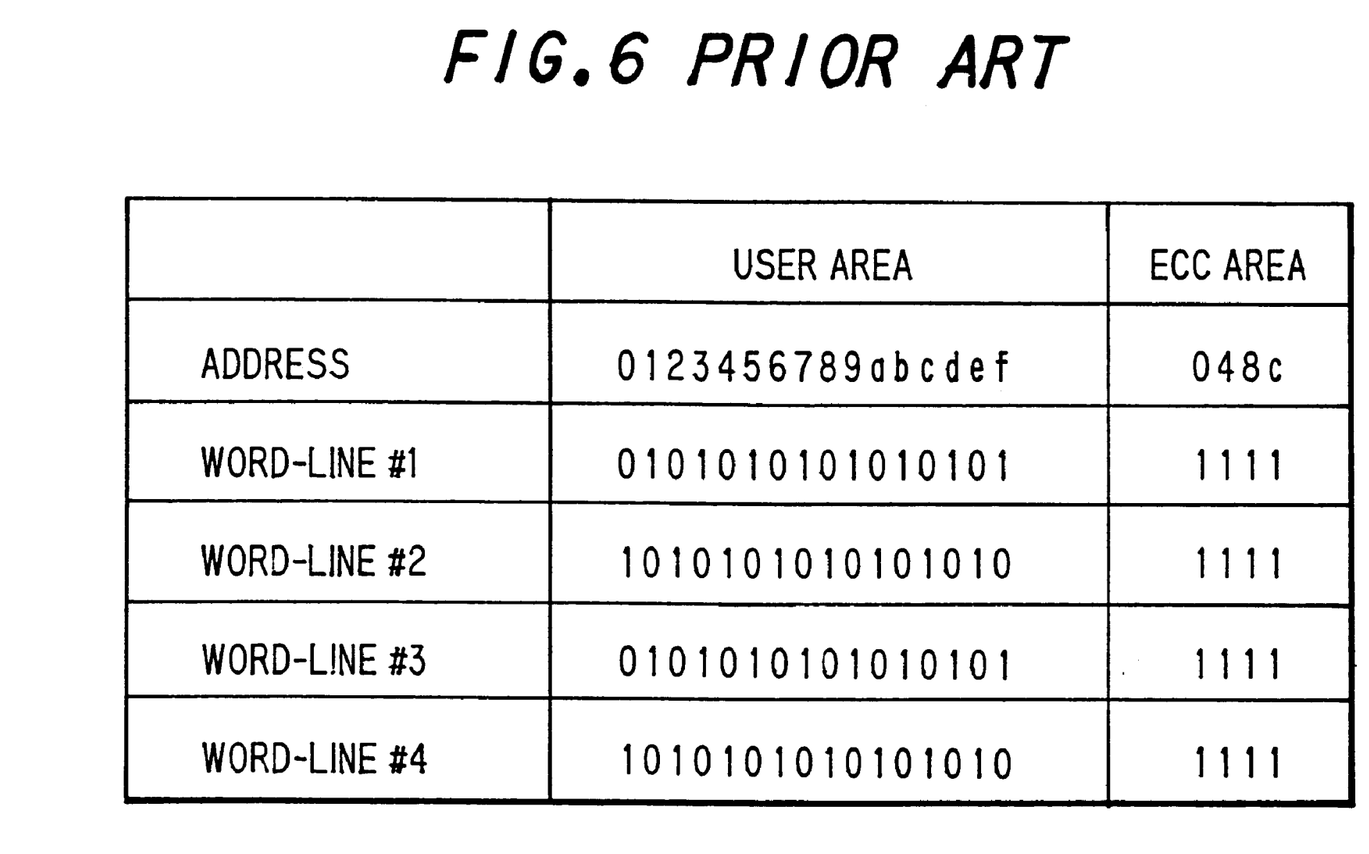
FIG. 6 is a schematic diagram illustrating the checker data written in a user area of one of the bit-columns BIT0 to BIT5 of the memory-cell array 52 of FIG. 5.

FIG. 6 is a schematic diagram illustrating the checker data written in a user area of one (BIT0, for example) of the bit-columns BIT0 to BIT5 (no ECC area is provided in the bit-columns BIT6 and BIT7) of the memory-cell array 52 of FIG. 5. In the checker data writing, input data are given to compose a checkerboard pattern in the memory-cell array, so that logic '0' and logic '1' are written alternately both in horizontal and vertical, to be read out and checked at once making use of a hardware logic.

Figure 7:
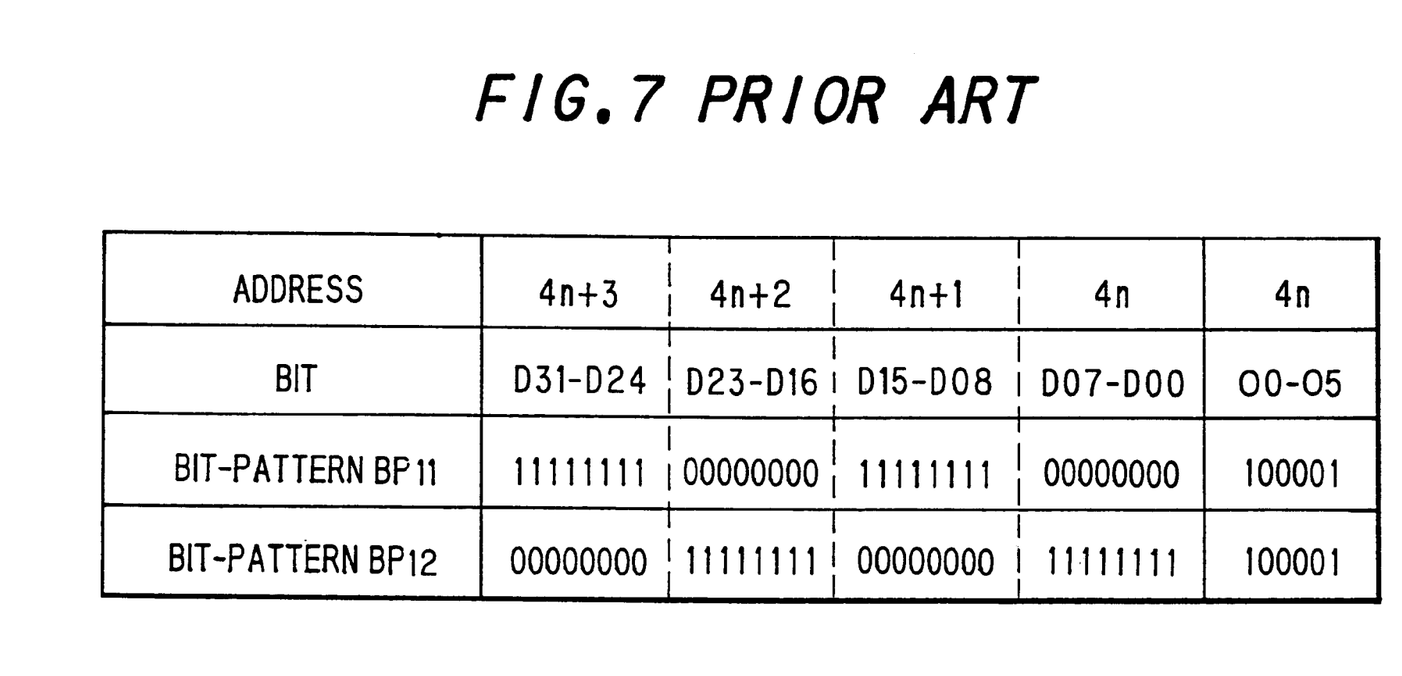
FIG. 7 is a schematic diagram illustrating bit-pattern examples of the checker data and ECC codes generated therefrom by the ECC code generation circuit of FIG. 4.

FIG. 7 is a schematic diagram illustrating bit-pattern examples of the checker data.

For writing the checkerboard pattern as illustrated in FIG. 6 in the user areas of bit-columns BIT0 to BIT7, input data D[31:0] of 32 bits having a bit-pattern BP11 of FIG. 7 are written four times on a word-line #1 of FIG. 5 by incrementing n from 0 to 3, and then, input data D[31:0] having another bit-pattern BP12 of FIG. 7 are written four times on a next word-line #2 by incrementing from 4 to 7. By repeating these procedures, the checkerboard pattern is written in the user area of each of the bit-columns BIT0 to BIT7.

However, in the ECC areas of the bit-columns BIT0 to BIT5 of the memory-cell array 52 of FIG. 5, the memory cells do not compose the checkerboard pattern, when checker data having the bit-patterns BP11 and BP12 of FIG. 7 are written in the user areas.

When the ECC code O[5:1] is generated from XORs of 14 bits of the input data D[31:0] by the ECC code generation circuit 51 having the configuration of FIG. 4, the ECC code O[5:1] becomes '100001' for both of the bit-patterns BP11 and BP12. Therefore, logic of every memory cell in the ECC area becomes '1' in the bit-column BIT0 and bit-column BIT5, as shown in FIG. 6, and becomes '0' in the bit-columns BIT1 to BIT4, disabling memory cells in the ECC areas to be checked at the same time with memory cells in the user areas.

Hence, in the conventional semiconductor memory device having the ECC circuit, the product inspection by checker data writing and reading should be performed two times, once for the user areas and once for the ECC areas making use of special checker data to compose the checkerboard pattern in the ECC areas.

The two times checker-data inspection makes high the cost of the product inspection.

Furthermore, it degrades the yield rate of the semiconductor memory device. In the semiconductor memory device having the ECC circuit, one-bit error in the 32-bit data can be corrected automatically. In other words, even if there is one-bit defect in 38 memory cells of an address unit, that is, addresses 4n, 4n+1, 4n+2 and 4n+3 of the user areas of the bit-columns BIT0 to BIT7 and an address 4n of the ECC areas of the bit-columns BIT0 to BIT5 of a semiconductor memory device, it call be used without problem. However, the checker-data inspection should be performed separately for the user areas and the ECC areas, in the conventional semiconductor memory device having the ECC circuit. Therefore, when one-bit defect is found in 6 bets of an address of the ECC areas in the checker-data inspection, the semiconductor memory device should have been rejected.

These are problems of the conventional semiconductor memory device having the ECC circuit.

SUMMARY OF THE INVENTION

Therefore, a primary object of the present invention is to provide a semiconductor memory device having an ECC circuit whereof checker-data inspection of memory cells in the user areas and the ECC areas can be performed at once, for improving productivity of the semiconductor memory device by reducing the inspection time and avoiding degradation of the yield rate because of unnecessary rejection.

In order to achieve the object, an ECC code generation circuit generates the ECC code of six bits whereof logic of each bit has XOR logic of each of six different combinations of 15 bits of the data set of 32 bits in a semiconductor memory device of the invention, and addresses in every user areas of the bit-columns are arranged in an order of 1, 4, 2, 5, 3, 6, . . . , b, f.

When a checkerboard pattern is written in the semiconductor memory device, a first data set having 32 bits of logic '0' and a second data set having 32 bits of logic '1' are written alternately, in addresses 4n to 4n+3 and 4(n+1) to 4(n+1)+3 of the user areas, respectively, together with ECC codes '000000' and '111111' thereof written in addresses 4n and 4(n+1) of the ECC areas, respectively, on odd-numbered word-lines, and written alternately on even-numbered word-lines in an inverse order of the odd-numbered word-lines, when checker-data inspection of the memory-cell array is performed, n being an integer not less than 0.

Therefore, the checker-data inspection of the user areas and the ECC areas of all bit-columns can be performed at once in the semiconductor memory device according to the embodiment, which enables to reduce inspection time into a half and to avoid unnecessary rejection of memory-cell arrays having allowable one-bit defect in an address unit, improving the productivity of the semiconductor memory device.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention win be described in connection with the drawings.

If there can be prepared two data sets which have bit-patterns being complementary to each other, that is, each bit of either of the bit-patterns having inverse logic of a corresponding bit of the other of the bit-patterns, and which give, at the same time, two ECC codes also complementary to each other, the checkerboard pattern can be written in the user areas and the ECC areas at once, by arranging addresses of the memory cells in an appropriate order.

However, with the conventional ECC code generation circuit as illustrated in FIG. 4, which outputs an ECC code whereof each bit has XOR logic of a combination of even number (14) bits, any pair of two complementary data sets gives the same ECC codes, because XOR logic of data of even number bits is the same with XOR logic of complementary data of the even number bits.

Figure 1:
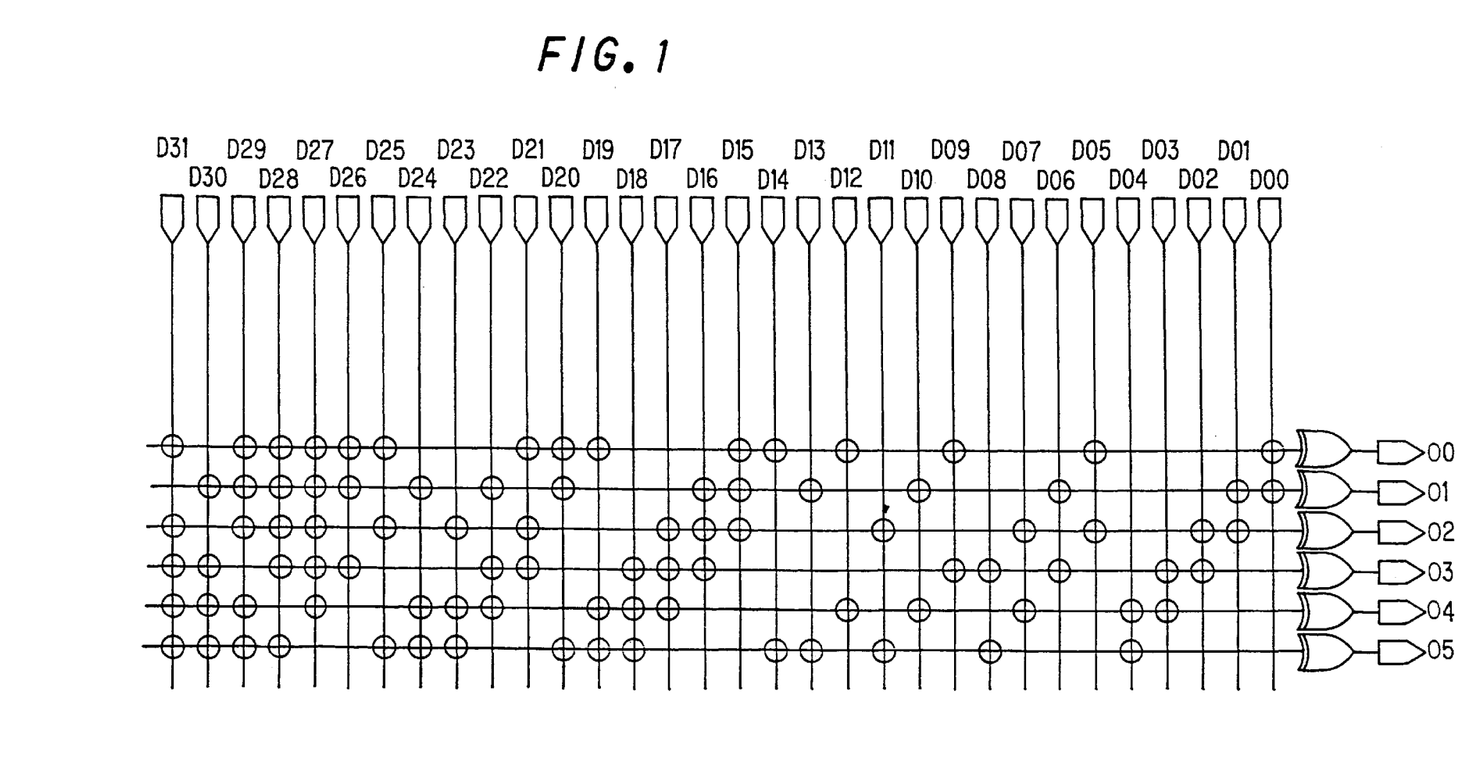
FIG. 1 is a schematic diagram illustrating an ECC code generation circuit according to an embodiment of the invention.

Therefore, the ECC code generation circuit of the embodiment generates the ECC code of six bits O0 to O5 whereof each has XOR logic of each different combination of 15 (odd number) bits selected from input data of 32 bits D00 to D31, such as illustrated in FIG. 1.

Figure 2:
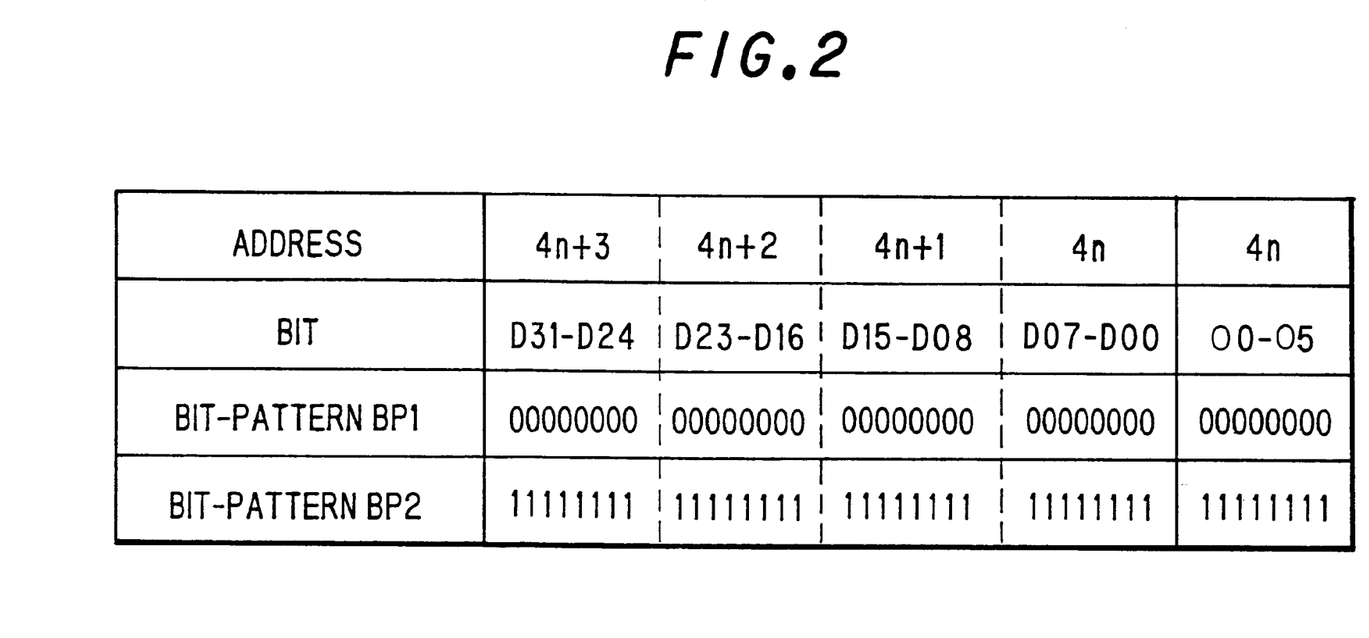
FIG. 2 is a schematic diagram illustrating bit-pattern examples BP1 and BP2 of the complementary data sets employed in the embodiment for writing a checkerboard pattern.

FIG. 2 is a schematic diagram illustrating bit-pattern examples BP1 and BP2 of the complementary data sets employed in the embodiment. All bits of the first bit-pattern BP1 have logic '0' and the ECC code generation circuit of FIG. 1 generates an ECC code of '000000' whereof six bits has XOR logic of six different combinations of 15 bits of the first bit-pattern BP1, while all bits of the second bit-pattern BP2 have logic '1' and the ECC code generation circuit generates a complementary ECC code of '111111' in the same way.

Figure 3:
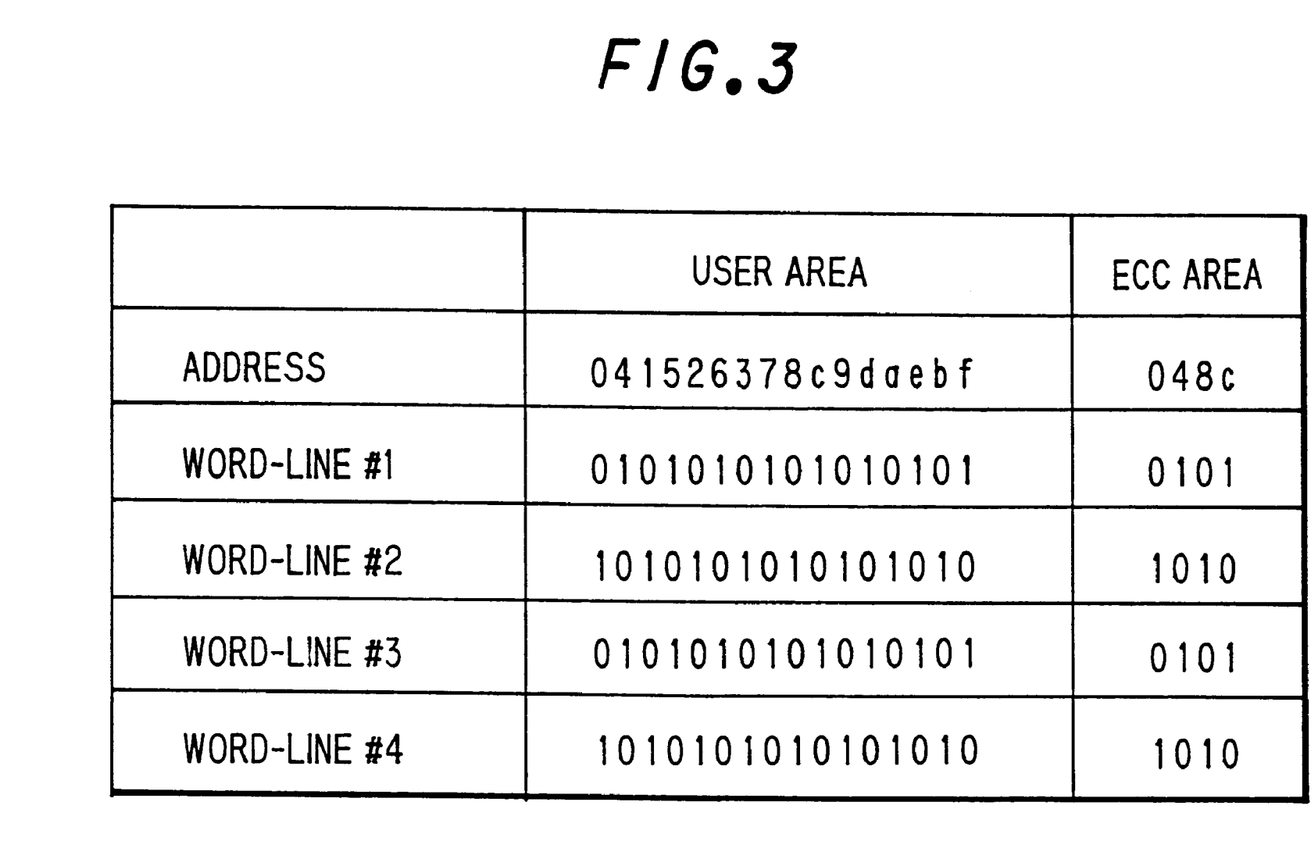
FIG. 3 is a schematic diagram illustrating an example of address arrangement of each of bit-columns of a memory-cell array according to the embodiment.

FIG. 3 is a schematic diagram illustrating an example of address arrangement of each of bit-columns BIT0 to BIT5 of a memory-cell array according to the embodiment having similar configuration of the memory-cell array 52 of FIG. 5. In the memory-cell array of FIG. 3, 16 addresses 0 to f (in hexadecimal) of the first word-line #1 are arranged in an order of 0, 4, 1, 5, 2, 6, . . . , b, f, so that bit-data of consecutive two data sets are to be ranged alternately. In the same way, 16 addresses 10 to 1f of the second word-line #2 are arranged in the order of 10, 14, 11, 15, . . . , 1b, 1f, and so on, on the word-lines #3, #4, . . . . Also in user areas of bit-columns BIT6 and BIT7 which have no ECC area, addresses are arranged in the same way.

Therefore, the checkerboard pattern as shown in FIG. 3 can be written at once in the user areas and the ECC areas of all of the bit-columns BIT0 to BIT7, by writing the pair of complementary data sets of 32 bits having the bit-patterns BP1 and BP2 of FIG. 2 alternately in an order of BP1, BP2, BP1, BP2 in addresses 4n, 4n+1, 4n+2 and 4n+3 on the first word-line #1 by incrementing n from 0 to 3 (and on the odd-numbered word-lines #3, #5, . . . ), and in the inverse order of BP2, BP1, BP2, BP1 in addresses 4n, 4n+1, 4n+2 and 4n+3 on the second word-line #2 by incrementing n from 4 to 7 (and on the even-numbered word-lines #4, #6, . . . ).

Thus, the checker-data inspection of the user areas and the ECC areas of all bit-columns can be performed at once in the semiconductor memory device according to the embodiment, which enables to reduce inspection time into a half and to avoid unnecessary rejection of memory-cell arrays having allowable one-bit defect in an address unit, improving the productivity of the semiconductor memory device.

Heretofore, the present invention is described in connection with the bit-pattern examples of BP1 and BP2 of FIG. 3. However, any pair of complementary data sets of appropriate length which generates a pair of complementary ECC codes can be applied for writing the checkerboard pattern, by arranging the order of addresses appropriately in each of the bit-columns BIT0 to BIT7, even though the bit patterns BP1 and BP2 are the simplest.

What is claimed is:

1. A semiconductor memory device having an ECC (Error Checking and Correcting) circuit and a memory-cell array including user areas and the ECC areas; the ECC circuit comprising:

an ECC code generation circuit for generating an ECC code to be written in the ECC areas from a data set to be written in the user areas, logic of each bit of the ECC having XOR (eXclusive OR) logic of each different combination of bits of a certain odd number of the data set, respectively;

wherein said memory cell array permits a single inspection, inspecting both the ECC areas and the user areas simultaneously, to insure memory cell arrays have one-bit or less allowable defect.

2. A semiconductor memory device as recited in claim 1; wherein the ECC code generation circuit generates the ECC code of six bits whereof logic of each bit has XOR logic of each of six different combinations of 15 bits of the data set of 32 bits.

3. A semiconductor memory device as recited in claim 1; wherein addresses are so arranged in each of bit-columns as to compose a checkerboard pattern when a pair of complimentary data sets is written alternately on a word-line of the memory-cell array.

4. A semiconductor memory device as recited in claim 2; wherein addresses in each of the user area are arranged in an order of $4n$, $4(n+1)$, $4n+1$, $4(n+1)+1$, $4n+2$, $4(n+1)+2$, $4n+3$, $4(n+1)+3$, $4(n+2)$, $4(n+3)$, $4(n+2)+1$, $4(n+3)+1$, ..., and addresses in each of the ECC areas are arranged in an order of $4n$, $4(n+1)$, $4(n+2)$, ..., in the memory-cell array, n being an integer not less than 0; and a first data set having 32 bits of logic '0' and a second data set having 32 bits of logic '1' are written alternately, in addresses $4n$ to $4n+3$ and $4(n+1)$ to $4(n+1)+3$ of the user areas, respectively, together with ECC codes thereof written in addresses $4n$ and $4(n+1)$ of the ECC areas, respectively, on odd-numbered word-lines, and written alternately on even-numbered word-lines in an inverse order of the odd-numbered word-lines, when checker-data inspection of the memory-cell array is performed.

* * * * *